United States Patent [19]
Marshall et al.

[11] Patent Number: 4,602,979
[45] Date of Patent: Jul. 29, 1986

[54] TECHNIQUE FOR THE GROWTH OF COMPOSITIONALLY UNGRADED SINGLE CRYSTALS OF SOLID SOLUTIONS

[75] Inventors: Robert C. Marshall, Concord; John K. Kennedy, West Roxbury; Charles S. Sahagian, Needham Heights, all of Mass.

[73] Assignee: The United States of America as represented by the Secretary of the Air Force, Washington, D.C.

[21] Appl. No.: 731,744

[22] Filed: May 7, 1985

Related U.S. Application Data

[63] Continuation of Ser. No. 434,648, Oct. 15, 1982, abandoned.

[51] Int. Cl.⁴ ............................................. C30B 15/10
[52] U.S. Cl. ....................... 156/617 M; 156/DIG. 83; 260/707
[58] Field of Search ........ 156/617 SP, 617 M, 616 R, 156/616 A, DIG. 83; 422/249; 260/707

[56] References Cited

U.S. PATENT DOCUMENTS

| | | |
|---|---|---|
| 2,858,199 | 10/1958 | Larson . |
| 3,053,635 | 9/1962 | Shockley ........................ 156/617 M |
| 3,058,854 | 10/1962 | Angello ............................ 148/1.6 |
| 4,071,396 | 1/1978 | Holman ...................... 156/DIG. 83 |
| 4,165,361 | 8/1979 | Milstein ...................... 156/DIG. 83 |

FOREIGN PATENT DOCUMENTS

| | | | |
|---|---|---|---|
| 2133875 | 1/1973 | Fed. Rep. of Germany ...... 156/607 |
| 156395 | 9/1982 | Japan .............................. 156/616 R |

Primary Examiner—Hiram H. Bernstein
Attorney, Agent, or Firm—Donald J. Singer; William J. O'Brien

[57] ABSTRACT

This invention describes a modified method of growing high purity, compositionally ungraded, single crystals of multicomponent solid solutions by the Czochralski, Kyropoulos, Bridgman or other related melt growth technique. In the method of this invention, the container or crucible used to contain the multicomponent crystal growing melt is fabricated from the higher melting point component of the multicomponent melt while lower melting point components are positioned within the crucible. The temperature of the crucible is then raised beyond the melting point of the lower melting point component to a temperature which is the exact melting point of the solid solution, or crystal alloy desired. This will dissolve an amount of the crucible material (higher melting point component) equal to the exact amount required to produce a solid solution having the desired composition. A seed is then introduced into the melt and normal crystal pulling is initiated resulting in the growth of a compositionally ungraded crystal having a uniform compositional content throughout its structure.

4 Claims, 2 Drawing Figures

TECHNIQUE FOR THE GROWTH OF COMPOSITIONALLY UNGRADED SINGLE CRYSTALS OF SOLID SOLUTIONS

STATEMENT OF GOVERNMENT INTEREST

The invention described herein may be manufactured and used by or for the Government for governmental purposes without the payment of any royalty thereon.

This application is a continuation of application Ser. No. 434,648, filed Oct. 15, 1982 now abandoned.

BACKGROUND OF THE INVENTION

This invention relates to a method for growing single crystal alloys having two or more organic or inorganic components. More particularly, this invention concerns itself with a method for growing high purity, compositionally ungraded, single crystals of solid solutions of materials systems composed of two or more components by utilizing the well known Czochralski, Kyropoulos, Bridgmen or other similarly related melt growth techniques.

In the Bridgman method, the melt is positioned in a vertical cylindrical container which tapers to a point at the bottom of the cylinder. The cylinder is then lowered into a cold zone. The Czochralski, or so-called crystal pulling technique, involves the use of a seed crystal which is placed on the end of a rod and then lowered into a crucible containing a molten bath of crystal growing material. The seed crystal is placed in contact with the surface of molten material and then slowly withdrawn from the melt. Since freezing occurs at the interface, growth occurs on the seed as it is withdrawn, resulting in the formation of a rod-like crystal boule. The Kyropoulos method is similar to that of Czochralski. In this technique, the seed, or cooled rod, remains in contact with the molten crystal growing material and slow cooling causes crystallization to occur from the seed or rod into the melt. In these methods, the seed or rod is often rotated as a modification of the basic techniques.

However, the lack of homogenity throughout the molten solution that comes in contact with the seed, as well as the possibility of contamination from the use of a crucible containing foreign material and the necessity to replenish expanded material when growing multicomponent crystal alloys, has spawned the growth of single crystal alloys of relatively poor quality with a rather high incidence of contaminated crystals lacking the high degree of purity required for many electronic applications. The problem is especially acute when growing single crystal alloys formulated from two or more compounding constituents.

The single crystal alloys grown by the method of this invention are compositionally ungraded of very high purity and, therefore, have proven to be especially useful in a wide variety of electronic applications. For example, the method of this invention is capable of producing compositionally ungraded crystal alloys from the germanium-silicon alloy system; as well as the binary, ternary or quaternary alloy systems of the Group III-V and the Group II-VI elements. The physical, electrical, optical, magnetic and chemical properties of these crystal alloys can differ from those of the components of the system and the manner in which these properties differ depends on the property and the alloy system being considered. It can be linear as in the case, for example, of the lattice constant for ternary intermetallic Group III-V compounds or, in the alternative, the variation can be from linear as, for example, the energy cap in the Ge-Si alloy system. The absolute value of a given property can be greater or less than that of any of the components of the system such as the melting point of solid solutions in systems having a continuous series of solid solutions and whose phase diagram exhibits a maximum or minimum melting point as exemplified, respectively, by the $c^1$ and 1-carvisome and the copper-gold systems. A large number of such properties vary as a function of the solid composition and it is the ability to grow compositionally, ungraded, high quality, single crystals, tailored to provide the desired values of these properties, which makes this invention so useful.

The Ge-Si alloys, for example, are useful for forward looking infra red detector (FLIR) systems operating in the 8-14 $\mu$m regions. Such systems would be able to operate at higher temperatures, thus reducing the weight and cost of such systems, in airborne reconnaissance systems remotely piloted vehicle (RPV) reconnaissance systems, and missile seeker systems. They are also useful for improved sensitivity of 1.06 $\mu$m PIN detectors currently being used for laser guidance in military weather systems; and, also, as an alternative material to the use of Group III-V compounds as a detector for optical communication systems in the 1.25 $\mu$m system.

The Group II-VI compounds, such as the ternary alloy, HgCdTe, are useful for infrared source and detector systems for missile guidance, for control or observation systems. The Group III-V ternary or quaternary alloys are useful for laser LED or detector systems optimized for command control and communication systems; and for, FET's, IMPATT or Gunn devices for microwave or mm wave systems.

Heretofore, a significant problem was encountered when resorting to the well known melt growth techniques, such as those of Czochralski, Kyropoulos or Bridgman. In utilizing these methods, the growing crystal was characterized by having a graded compositional content as the melt solidified. This problem could be avoided only by replenishing the melt with one of the components of the melt. Replenishing the melt, however, often resulted in the introduction of contaminants which produced crystals of lower purity than desired. With the present invention, however, the problem of a changing melt which results from the growth of a solid material of different composition from the melt from which it grows, is overcome. In the present invention, the crucible which holds the crystal growing melt is fabricated from one of the components which forms the desired single crystal alloy. This provides an in-situ source of material being depleted from the melt as the crystal is grown and a method of incorporating that component in the melt.

The technique of this invention solves the problem by producing crystals in high purity. It eliminates contamination caused by the use of an outside replenishing material, as well as contamination caused by the use of a crucible made of a foreign material. It also solves the problem of spurious nucleation caused by depletion from the melt of particles of the component being added to the melt as a solid. Such nucleation is possible if the added component is less dense than the melt since it could float to the solid liquid interface of the growing crystal before dissolving. If the added component is more dense than the melt, then it often fails to sink because of surface tension forces.

SUMMARY OF THE INVENTION

In accordance with the general concept of this invention, it has been found that single crystal alloys having an ungraded or uniform compositional content of two or more elements throughout its structure can be prepared by a modified melt growth technique which employs a crucible fabricated from one component contained in the multi-component crystal growing melt utilized to grow a desired crystal. The crucible material is characterized by having a melting point which is higher than the melting point of the other component in the multi-component melt. For example, in a binary crystal system having a continuous source of solid solutions in which the freezing point curve, as seen in a typical phase diagram, increases regularly, such as in the germanium-silicon systems, the higher melting point silicon material is referred to as component B while the lower melting point germanium material is referred to as component A. The crucible, therefore, is fabricated from component B and component A having the lower melting point, is placed in the crucible. The temperature of the crucible is then raised beyond the melting point of component A to a temperature which is the exact melting point of the solid solution desired. Component A will dissolve an amount of the container equal to the exact amount required to yield a solid solution having the composition desired. A seed is then introduced into the melt and normal Czochralski pulling is initiated. According to the phase diagram of such a system, growth of the crystal of the solid solution will cause the melt to have a tendency to become richer in component A, however, this tendency will be offset, and the melt composition will remain constant, as additional B material of the crucible is dissolved due to the constant temperature. The resulting single crystal alloys are characterized by having a uniform compositional constant throughout their structure and are considered to be ungraded, as opposed to a graded crystal structure (e.g. a crystilline structure having striations or layers each of which have a compositional constant that differs in each structure from that of any adjoining striation) that is often produced by conventional melt growth techniques such as Czochralski.

Accordingly, the primary object of this invention is to provide a technique for growing single crystals containing two or more components in predeteremined proportions for use in semiconductor applications.

Another object of this invention is to provide a method for growing high purity, compositionally ungraded, single crystal alloys of solid solutions of materials which are composed of two or more components.

Still another object of this invention is to provide a method specifically adapted to growing high purity, highly uniform, semiconductor materials formed of binary compounds of silicon and germanium; and binary, ternary and quaternary compounds of the group III-V and group II-VI elements of the periodic table.

The above and still other objects and advantages of the present invention will become more readily apparent upon consideration of the following detailed description thereof when viewed in conjunction with the accompanying drawings.

DETAILED DESCRIPTION OF THE DRAWINGS

Figure 1:
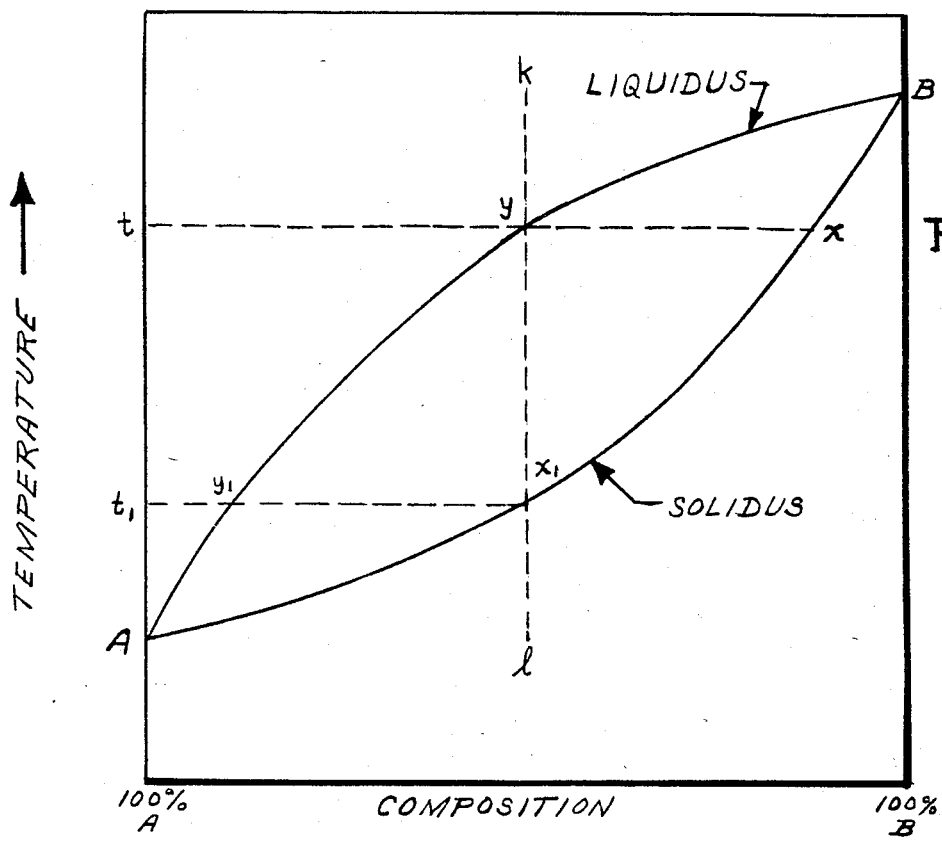
Figure 2:
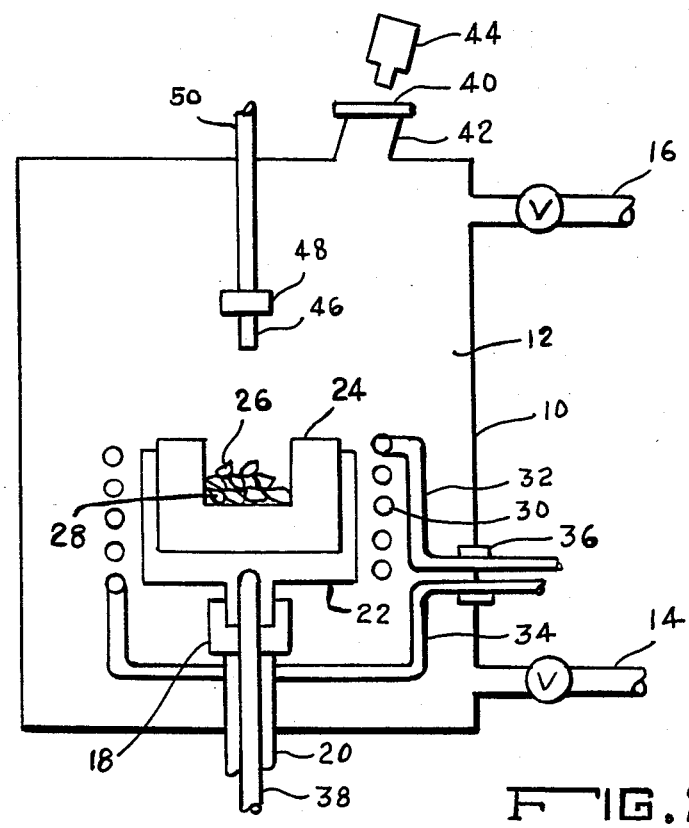

In the drawings:

FIG. 1 is a condensed phase diagram of a crystal alloy system having a continuous system of completely miscible solid solutions; and FIG. 2 is a schematic illustration of a a crystal growing apparatus suitable for carrying out the method of this invention.

DESCRIPTION OF THE PREFERRED EMBODIMENTS

With the above and other objects in mind, the present invention contemplates a novel method for growing highly pure, compositionally ungraded, single crystal alloys that are especially useful as semiconductor materials in a wide variety of electronic applications.

Crystalline materials, both polycrystalline or single crystal in nature, are widely used for a variety of electronic applications. When used with proper doping, multi-component single crystals possess semiconductor and electroluminescent properties and are widely employed for such purposes. Generally, the single crystal alloys are formed by combining silicon and germanium; elements from Group III and V of the periodic table, or elements from Group II and VI of the table. These crystals are generally referred to by the well known term "III-V compounds" or "II-VI" compounds. Although the present invention is directed primarily at growing such single crystal alloys, it is not limited thereto, but includes the growth or synthesis of other binary, ternary or quaternary systems of both inorganic and organic materials; to systems having congruently or incongruently melting components or combinations thereof; to systems which form a continuous series of solid solutions and in which (1) the freezing point curve increases regularly, or (2) the freezing point curve has a maximum or a minimum; to solid solution systems exhibiting complete miscibility or partial miscibility in which (1) the discontinuity is a eutectic point, or (2) the discontinuity is a transition point; or systems having combinations of the above.

Generally, electroluminescent devices are fabricated from a single crystal alloy such as gallium phosphide, which includes a p-n junction. The crystal must be doped, typically, in the case of red light emitting gallium phosphide with oxygen and zinc (p-type) or with tellurium, selenium or sulphur (n-type). Green light-emitting gallium phosphide contains p-type material doped with nitrogen.

Forward biasing of the p-n junction injects electrons from the n-side into the p-side whereat some electrons are trapped by the zinc-oxygen complex, such as in the case of red light-emitting GaP. The trapped electrons subsequently trap, or recombine with, holes to produce an exiton resulting in the emission of characteristic radiant energy. Such radiant energy, in the case of the zinc-oxygen dopants in gallium phosphide, is in the red portion of the visible spectrum. Thus, the electroluminescence of these diodes is due to the band-gap of the crystals being large enough to encompass the visible radiation spectrum. That is, electroluminescense is caused by an electron-hole recombination mechanism.

As is well known, the above-described single crystals exhibit electroluminescence only upon the proper inclusion therein of appropriate dopants. For example, when a single crystal of GaP contains substantial amounts of substitutional oxygen and zinc, it electroluminesces in the red region of the visible spectrum. The inclusion of a different dopant, for example nigrogen, results in a single crystal which may electroluminesce in the green region of the visible spectrum.

It should be noted that as used herein the terms "dopant" and "impurity" convey diametrically opposite meanings. Specifically, an impurity is any substance which when incorporated into a crystal, affects its electrical, physical, chemical, etc. properties in some undesired fashion. A dopant is similar to an impurity but is intentionally incorporated in small amounts into the crystal to effect some desired property therein. Thus, oxygen and zinc, intentionally incorporated into a single crystal which is intended to electroluminesce in the red region of the visable spectrum, are dopants,. Oxygen incorporated into a single crystal ultimately intended to electroluminesce in the green region of the visible spectrum may be an impurity.

Electroluminescent diodes and other devices made from single crystals of the III–V or II–VI compounds are more sturdy, reliable and longer-lived than, and are accordingly replacing, conventional incandescent lamps in a number of applications. Additionally, such diodes and devices are compact, compatible with solid state circuitry and require very little power for operation.

Generally, these crystals are grown by well known melt growth techniques, such as those referred to conventionally as the Czochralski, or Bridgeman, or Kyropolulos crystal growing method. In using these methods, however, considerable difficulty is encountered in growing crystals that are free, or relatively free, from impurities. Or, in considering the problem in another vane, free from the introduction of unwanted and undesirable materials that are similar to dopants. In order to control the amount and type of doping added to produce certain desired properties, it is essential that one start with a pure or highly pure crystal alloy with little or no impurities being added during the growing process. With the well known melt growth techniques, referred to above, the introduction of impurities often take place during crystal growth, thus rendering the resultant crystal unuseable for semiconductor and electroluminescent applications.

The present invention, however, concerns itself with a modification of the conventional melt growth techniques of Czochralski, Bridgman or Kyropoulos, and constitutes an unexpected improvement thereover. In general, this invention describes a modified method for the growth of high purity, compositionally ungraded, single crystals of solid solutions by the Czochralski, Kyropoulos, Bridgman or other related melt growth technique. The method can be applied to the growth of solid solutions in material systems yielding either completely miscible or partially miscible solid solutions.

In this method, the crucible, which is used for growing the crystal, such as in the Czochralski technique, is fabricated from one of the crystal growing materials used to make up the multi-component composition of the crystal growing melt. The crucible material constitutes the higher melting point material of the melt, referred hereinafter as component B, while the other component of the melt having the lower melting point and herinafter referred to as component A is placed in the melt. For example, the crystal growing melt could be composed of a binary system of germanium and silicon which displays a continuous series of solid solutions in which the freezing point increases regularly and, in which case, the crucible would be made of silicon as the high melting point component B, while the germanium or low melting point component A sould be added to the crucible.

The temperature of the crucible is then raised beyond the melting point of component A to a temperature which is the exact melting point of the solid solution desired according to its phase diagram. Component A will dissolve an amount of the crucible container equal to the exact amount required to yield a solid solution having the composition desired. A seed is then introduced into the melt and normal Czochralski pulling is initiated. According to the phase diagram of such a system, growth of the crystal of the solid solution will cause the melt to have a tendency to become richer in component A, however, this tendency will be offset, and the melt composition will remain constant, as additional B material of the crucible is dissolved due to the constant temperature.

With the foregoing general discussion in mind, there is presented a more detailed explanation of the present invention which will serve to illustrate to those skilled in the art the manner in which this invention is carried out in effect. Attention is now directed to FIG. 2 in the drawing which discloses, in schematic form, a conventional Czochralski type crystal growing apparatus. The apparatus is suitable for carrying out the method of this invention and comprises a pressure tight enclosure 10 designed to permit the evacuation and pressurizing of the internal volume 12. The internal volume 12 can be evacuated through the valve controlled line 14 which is connected to a vacuum pump, not shown, or pressurized through valve controlled line 16 which is connected to a source of pressurized gas, not shown.

Within the enclosure 10 there is a crucible support 18, which rests on and is electrically insulated from a load bearing rod 20, which in turn can be moved in a vertical direction and rotated by any suitable mechanism located external to the enclosure 10. Resting on the crucible support 18 is a graphite susceptor 22. A dopant 28, in any suitable form is placed inside a hollowed out silicon rod 24. Heat is provided by R.F. coils 30 connected through leads 32 and 34 by way of a coupling 36 to an R. F. power supply, not shown. The temperature within the system is monitored by a thermocouple 38 the junction of which is located in the graphite susceptor 22 directly below the silicon crucible 24. The thermocouple leads are brought out of the enclosure 10 through the crucible support 18 and load bearing rod 20 to a MV meter or other suitable reading or recording device, not shown. The temperature within the system can also be measured by means of an optical pyrometer 44 which can be positioned to sight through a quartz window 40 located at the end of the viewing port 42.

In order to further illustrate the invention, reference is now made to FIGS. 1 and 2 of the drawing. In order to grow a compositionally ungraded single crystal alloy, such as a germanium-silicon binary compound, a crystal growing system is set up as shown in FIG. 2. The Ge-Si binary compound is also defined by point x located on the liquidus-solidus curve of the phase diagram of FIG. 1. Referring again to FIG. 2, a power supply is turned on and the temperature in the crucible is increased beyond the melting point of the germanium 26 to t, as shown in FIG. 1, the melting point of the Ge-Si alloy desired. At t, the molten Ge will dissolve the dopant 28 and an amount of silicon from the crucible 24 equal to the exact amount required to produce a Ge-Si melt of the exact composition desired (point x of FIG. 1). A single crystal seed 46, held in a seed holder 48, is attached to a pull rod 50 which can be moved in a vertical direction and rotated by any suitable means located external to the enclosure 10. The seed 46 is lowered into the melt and normal Czochralski pulling is initiated. According to the phase diagram of FIG. 1, growth of a Ge-Si crystal of composition x from a melt of composition y will cause the melt to become richer in Ge. However, because the melt is contained in a Si crucible 24 and the temperature of the melt is held constant at t, the composition of the melt will remain constant since the maintainance of the temperature t forces the melt to dissolve enough Si from the crucible to exactly offset the loss of Si to the growing crystal. In addition, since the crucible 24 is made of Si, a component of the system, no contamination is introduced into the growing crystal from the crucible.

Initially, the seed crystal 46 is made from germanium and a crystal of desired compositional content is pulled from the melt. This crystal is selectively cut and then used as a seed crystal for subsequent crystal growing to provide good lattice match during initial nucleation. Also, if one starts with pure germanium, or component A as circumstances require, then it becomes necessary to allow the melt to remain at the desired temperature until the molten silicon from the crucible 24 saturates the germanium 26. However, as an alternative embodiment, the melt can be made up of the desired combination of silicon and germanium ingredients required to produce the desired crystal alloy such that the silicon from the crucible 24 merely replenishes the melt when it reaches the desired temperature without the disadvantage of requiring a period of time necessary to reach saturation.

The use of a closed or pressurized system, as indicated in FIG. 2, is desired for use when growing compositions in which either or both of the low melting and high melting components are not stable at their respective melting points, such as the "III–V" and "II–VI" compounds, and tend to dissociate. In such cases, the exercise of standard liquid encapsulation technique is preferred.

The Czochralski technique, exemplified above, is a well known method for the melt growth of single crystals, and has been used extensively for the growth of high quality single crystals of materials such as germanium, silicon, "III–V" binary compounds and "II–VI" compounds for the electronics industry.

However, when the Czochralski method is used to grow single crystals of materials which grow from a liquid, not as a pure material, but as an homogeneous solid solution, experience and the phase diagrams of such systems show that the stoichiometric composition of the resultant crystal varies as the crystal grows. The cause for this compositional variation can be found by examining the phase diagram of such a system. An example of one such system in which a continuous series of completely miscible solid solutions form is shown in FIG. 1. In a phase diagram of the type shown in FIG. 1, the abscissa represents the atomic percentages of components A and B while the ordinate represents the temperature in degrees centigrade. The curve marked "solidus" represents the atomic percent of the alloy at the particular temperature and the curve marked "liquidus" represents the atomic percent of the liquid alloy at the particular temperature. The particular phase diagram of FIG. 1 shows a common condensed phase digram of the type in which the freezing points of all mixtures lie between those of the pure components A and B. The upper liquidus curve gives the composition of the liquid phase in equilibrium with the solid solution whose composition is indicated by the corresponding point on the lower solidus curve. Thus, for example, at any temperature t, the liquid represented by the point y will be in equilibrium with solid solution x. It should be noted that at any temperature the liquid phase always contains more of, component A than the solid phase which freezes from it. As crystal growth from such a system proceeds, the composition of the system as a whole remains constant. However, the composition of the liquid originally given by y will change because the solid freezing from it is richer in component B. The growth of the crystal therefore results in a change in the liquid composition making the solution richer in component A. As the composition of the liquid changes, the composition of the crystal growing from the solution changes (as required by the phase diagram) and the resulting crystal becomes compositionally graded and undesirable for use in the electronic applications.

The main purpose of this invention is to provide a method for maintaining a constant melt composition during the melt growth of single crystals of solid solutions of which FIG. 1 is a simple example. It is a further purpose of this invention to provide a method for the growth of such solid solutions in a manner which eliminates contamination of the crystal from crucibles made of materials foreign to the materials system comprising the solid solution to be grown.

Additional examples of specific crystalline materials prepared in accordance witrh the teachings of this invention can be found in Examples 1 and 2 which follow. Example 1 discloses a germanium-silicon system while Example 2 illustrates a mercury-cadmium-tellurium system.

EXAMPLE 1

A melt of liquidus composition 15 $^A/O$ (atomic percent) silicon and 85 $^A/O$ germanium would yield a solidus crystal of composition 45 $^A/O$ silicon and 55 $^A/O$ germanium. A melt of liquidus composition 30 $^A/O$ silicon and 70 $^A/O$ germanium would yield a solidus crystal of 66 $^A/O$ silicon and 34 $^A/O$ germanium.

EXAMPLE 2

A melt of liquidus composition 20 $^A/O$ cadmium telluride and 80 $^A/O$ mercury telluride would yield a solidus crystal of the composition 60 $^A/O$ cadmium telluride and 40 $^A/O$ mercury telluride.

All of the above is accomplished with the present invention by fabricating the crucible from the higher melting point component contained in the crystal growing melt. In the example above, the germanium-silicon material represents an inorganic binary system which exhibits a continuous series of completely micscible solid solutions. These particular Q components are congruously melted and have negligible vapor pressure.

As a result, single crystal alloys of compositionally ungraded solid solutions can be grown. High purity can be achieved since a crucible containing foreign material is eliminated and the necessity of adding solid material to the melt to maintain the melt composition is likewise eliminated. The invention also eliminates spurious nucleation problems caused by the addition of a component to the melt to maintain the melt composition and, in some instances, eliminates contamination from the heating elements such as a graphite susceptor or heater. The invention is applicable to two or more component systems, to inorganic or organic systems, to systems having congruently or incongruently melting components or combinations thereof, and is applicable to systems with completely or partially miscible solid solutions. It especially solves the problem of a changing melt composition, which results from the growth of a solid material of different composition from the melt from which it grows, by providing an in-situ source of the material being depleted from the melt. It also provides the means of incorporating that component into the melt, as well as the problem of producing such crystals in high purity by eliminating contamination due to the use of a crucible made of a foreign material.

The method of this invention is clearly applicable to other materials which can be formed into rod-like, single crystals or where a seed crystal comes in contact with a molten solution of crystal growing material. It is to be understood, also, that the method of this invention may be altered or modified in any manner which suggests itself to those skilled in the art, and that all such modification as fall within the scope of the appended claims are intended to be included herein.

What is claimed:

1. A method for growing a highly pure, multi-component, compositionally ungraded, single crystal alloy product, said method comprising the steps of:
    a. providing a crucible fabricated from a high melting point alloy-forming component, said high melting point alloy-forming component being one component of said single crystal alloy product;
    b. placing in said crucible at least a low melting point alloy-forming component of said single crystal alloy product;
    c. heating said crucible to a temperature which is above the melting point of said low melting point alloy-forming component and is equal to the exact melting point of the said multi-component crystal alloy product, thus dissolving an amount of said crucible equal to the exact amount required to yield a liquid solution in equilibrium with the compositional content of said multi-component, compositionally ungraded, single crystal alloy product;
    d. placing a seed crystal in contact with said liquid solution; and
    e. withdrawing said seed crystal from said solution at a rate which will allow the growth of said multi-component, compositionally ungraded, single crystal alloy product on said seed crystal while simultaneously maintaining said crucible at said temperature, thus dissolving sufficient high melting point alloy-forming component from said crucible to maintain said liquid solution in equilibrium.

2. A method in accordance with claim 1 wherein said placing in said crucible further includes at least a high melting point alloy-forming component.

3. A method in accordance with claim 1 wherein said molten solution is selected from the group consisting of germanium and germanium-silicon alloys, and said crucible is fabricated from silcon;

4. A method in accordance with claim 1 wherein said molten solution is a mixture of germanium and silicon having a predetermined compositional content and said crucible is fabricated from silicon.

* * * * *